US012641963B2

(12) United States Patent
Choi et al.

(10) Patent No.: US 12,641,963 B2
(45) Date of Patent: May 26, 2026

(54) DISPLAY PANEL WITH SECOND DISPLAY AREA AND PERIPHERAL AREA WITH OLED FOR USE IN DISPLAY APPARATUS

(71) Applicant: Samsung Display Co., Ltd., Yongin-si (KR)

(72) Inventors: Seonyoung Choi, Yongin-si (KR); Gyungsoon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 571 days.

(21) Appl. No.: 17/866,390

(22) Filed: Jul. 15, 2022

(65) Prior Publication Data

US 2023/0021482 A1     Jan. 26, 2023

(30) Foreign Application Priority Data

Jul. 26, 2021     (KR) ........................ 10-2021-0098112

(51) Int. Cl.
| | |
|---|---|
| *H10K 59/123* | (2023.01) |
| *H10D 86/40* | (2025.01) |
| *H10D 86/60* | (2025.01) |
| *H10K 59/121* | (2023.01) |

(Continued)

(52) U.S. Cl.
CPC ....... *H10K 59/123* (2023.02); *H10K 59/1213* (2023.02); *H10K 59/122* (2023.02); *H10D 86/441* (2025.01); *H10D 86/60* (2025.01); *H10K 59/80515* (2023.02)

(58) Field of Classification Search
CPC ............... H10K 59/123; H10K 59/122; H10K 59/1213; H10K 50/813; H10K 50/865; H10K 59/805; H10K 50/00; H10K 59/80515; H10K 50/81; H10K 2102/351;

(Continued)

(56) References Cited

U.S. PATENT DOCUMENTS

| | | | |
|---|---|---|---|
| 7,084,849 B2 | 8/2006 | Noguchi et al. | |
| 7,542,114 B2 | 6/2009 | Nakamura et al. | |
| 10,263,211 B2 * | 4/2019 | Byun ................. | H10D 30/6723 |

(Continued)

FOREIGN PATENT DOCUMENTS

| | | |
|---|---|---|
| CN | 111341936 A | 6/2020 |
| KR | 10-0614030 B1 | 8/2006 |

(Continued)

*Primary Examiner* — Davienne N Monbleau
*Assistant Examiner* — Heim Kirin Grewal
(74) *Attorney, Agent, or Firm* — Womble Bond Dickinson (US) LLP

(57) ABSTRACT

A display panel includes: a substrate including a first display area, a second display area, and a peripheral area; a first pixel circuit at the first display area and a first display element connected to the first pixel circuit; a second display element at the second display area; a second pixel circuit at on the peripheral area; a connection line between the substrate and the second display element and connecting the second display element to the second pixel circuit; and a connection portion on a different layer from the connection line and connected to the second display element, wherein the second display element includes a second pixel electrode, wherein the second pixel electrode is on a same layer as the connection portion and covers at least a portion of the connection portion.

20 Claims, 12 Drawing Sheets

(51) Int. Cl.
  *H10K 59/122*   (2023.01)
  *H10K 59/80*   (2023.01)

(58) Field of Classification Search
  CPC ....... H10K 59/65; H01L 27/124; H01L 27/00;
               H01L 27/1248
  See application file for complete search history.

(56)       References Cited

U.S. PATENT DOCUMENTS

| | | | |
|---|---|---|---|
| 10,290,694 B2 * | 5/2019 | Xiang | ................ H10K 59/1315 |
| 10,580,848 B1 * | 3/2020 | Ma | ......................... H10K 59/00 |
| 10,707,281 B2 * | 7/2020 | Kuo | ..................... H10K 59/65 |
| 2005/0270259 A1 * | 12/2005 | Shirasaki | ........... H10K 59/1315 |
| | | | 345/76 |
| 2016/0020262 A1 * | 1/2016 | Ahn | ..................... H10K 59/122 |
| | | | 438/23 |
| 2017/0141172 A1 * | 5/2017 | Cho | ..................... H10K 59/123 |
| 2018/0197927 A1 * | 7/2018 | Tan | ......................... H10K 71/00 |
| 2019/0067389 A1 * | 2/2019 | Ai | .......................... H10K 50/11 |
| 2019/0245017 A1 * | 8/2019 | Jeon | ................... H10K 59/8792 |
| 2021/0193758 A1 * | 6/2021 | Choi | ..................... H10K 59/123 |
| 2021/0202608 A1 * | 7/2021 | Lee | ................. H10K 59/80522 |
| 2021/0202641 A1 * | 7/2021 | Shin | ..................... H10K 59/121 |
| 2021/0327958 A1 * | 10/2021 | Li | ......................... H10H 20/833 |
| 2022/0208912 A1 | 6/2022 | Jeon et al. | |
| 2024/0162247 A1 * | 5/2024 | Li | .......................... H10D 86/60 |

FOREIGN PATENT DOCUMENTS

| | | | | |
|---|---|---|---|---|
| KR | 10-0953018 B1 | | 4/2010 | |
| KR | 1020200106430 | * | 8/2020 | ............. H01K 59/00 |
| KR | 10-2022-0095399 A | | 7/2022 | |

* cited by examiner

DISPLAY PANEL WITH SECOND DISPLAY AREA AND PERIPHERAL AREA WITH OLED FOR USE IN DISPLAY APPARATUS

CROSS-REFERENCE TO RELATED APPLICATION

This application claims priority to and the benefit of Korean Patent Application No. 10-2021-0098112, filed on Jul. 26, 2021, in the Korean Intellectual Property Office, the disclosure of which is incorporated by reference herein in its entirety.

BACKGROUND

1. Field

Aspects of some embodiments relate to a display panel and a display apparatus including the display panel.

2. Description of the Related Art

Recently, the use of display apparatuses has become more diversified. Also, display apparatuses have become relatively thinner and more lightweight compared to previous generations of display devices, and thus, the use of display apparatuses has expanded.

As display apparatuses are used in various ways, various methods may be used to design the shapes of the display apparatuses. In addition, the number of functions that may be added or linked to display apparatuses is increasing.

The above information disclosed in this Background section is only for enhancement of understanding of the background and therefore the information discussed in this Background section does not necessarily constitute prior art.

SUMMARY

Aspects of some embodiments relate to a display panel and a display apparatus including the display panel, and for example, to a display panel with an extended display area that allows an image to be displayed even in an area in which a component that is an electronic element is arranged, and a display apparatus including the display panel.

Some embodiments include a display panel having a relatively expanded display area configured to enable images to be displayed even in an area in which a component that is an electronic element is arranged, and a display apparatus including the display panel. However, this is merely an example, and the scope of embodiments according to the present disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate including a first display area, a second display area, and a peripheral area, a first pixel circuit arranged on the first display area and a first display element connected to the first pixel circuit, a second display element arranged on the second display area, a second pixel circuit arranged on the peripheral area, a connection line arranged between the substrate and the second display element and connecting the second display element to the second pixel circuit, and a connection portion arranged on a different layer from the connection line and connected to the second display element, wherein the second display element includes a second pixel electrode, wherein the second pixel electrode is arranged on a same layer as the connection portion and covers at least a portion of the connection portion.

According to some embodiments, the connection portion may include a transparent conductive oxide.

According to some embodiments, at least a portion of an edge of the second pixel electrode may have a rounded shape.

According to some embodiments, the second pixel electrode may have a circular shape.

According to some embodiments, the display panel may further include a pixel-defining layer having an opening exposing a center of the second pixel electrode and covering an edge of the second pixel electrode, wherein the pixel-defining layer may include a light-blocking material.

According to some embodiments, the pixel-defining layer may have a donut shape.

According to some embodiments, at least a portion of the opening of the pixel-defining layer may have a rounded shape.

According to some embodiments, a thickness of the second pixel electrode and a thickness of the connection portion may be each about 1000 Å to about 1500 Å.

According to some embodiments, the connection portion may have a polygonal shape in a plan view.

According to some embodiments, a shape of an emission area of the second display element may be different from a shape of the second pixel electrode.

According to some embodiments, the second pixel electrode may have a polygonal shape with rounded corners.

According to one or more embodiments, a display apparatus includes a display panel including a first display area, a second display area, and a peripheral area, and a component arranged below the display panel to correspond to the second display area, wherein the display panel includes: a substrate, a first pixel circuit arranged on the first display area and a first display element connected to the first pixel circuit, a second display element arranged on the second display area, a second pixel circuit arranged on the peripheral area, a connection line arranged between the substrate and the second display element and connecting the second display element to the second pixel circuit, and a connection portion arranged on a different layer from the connection line and connected to the second display element, wherein the second display element includes a second pixel electrode, wherein the second pixel electrode is arranged on a same layer as the connection portion and covers at least a portion of the connection portion.

According to some embodiments, the connection portion may include a transparent conductive oxide.

According to some embodiments, at least a portion of an edge of the second pixel electrode may have a rounded shape.

According to some embodiments, the display panel may further include a pixel-defining layer having an opening exposing a center of the second pixel electrode and covering an edge of the second pixel electrode, wherein the pixel-defining layer may include a light-blocking material.

According to some embodiments, at least a portion of the opening of the pixel-defining layer may have a rounded shape.

According to some embodiments, a shape of an emission area of the second display element may be different from a shape of the second pixel electrode.

According to some embodiments, a thickness of the second pixel electrode and a thickness of the connection portion may be each about 1000 Å to about 1500 Å.

According to some embodiments, the second pixel electrode may have a circular shape.

According to some embodiments, the component may include an imaging device.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
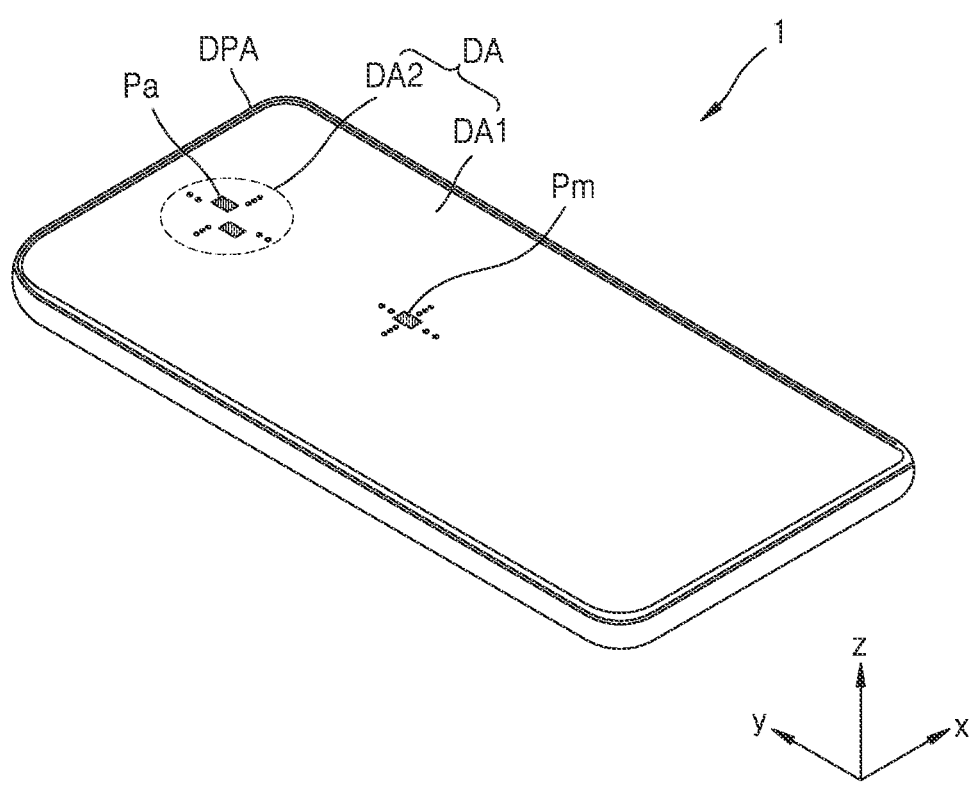
FIG. 1 is a perspective view schematically illustrating a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, aspects of some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, aspects of some embodiments will be described in more detail with reference to the accompanying drawings. When describing embodiments with reference to the accompanying drawings, the same or corresponding elements are denoted by the same reference numerals and redundant descriptions thereof are omitted.

It will be further understood that, when a layer, region, or element is referred to as being "on" another layer, region, or element, it can be directly or indirectly on the other layer, region, or element. That is, for example, intervening layers, regions, or elements may be present. Also, sizes of elements in the drawings may be exaggerated or reduced for convenience of explanation. For example, because sizes and thicknesses of elements in the drawings are arbitrarily illustrated for convenience of explanation, the disclosure is not limited thereto.

In the following embodiments, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a perspective view schematically illustrating a display apparatus 1 according to some embodiments.

Referring to FIG. 1, the display apparatus 1 includes a display area DA and a peripheral area DPA outside the display area DA. The display area DA may include a first display area DA1 and a second display area DA2. The first display area DA1 may be arranged to surround at least a portion of the second display area DA2. The first display area DA1 may be a main display area, and the second display area DA2 may be a component area, in which a component is arranged, and an auxiliary display area. That is, the first display area DA1 and the second display area DA2 may display an image individually or together. For example, in some instances, the first display area DA1 may display a first sub-portion of an image, and the second display area DA2 may display a second sub-portion of an image, and collectively, the first and second sub-portions of an image may display the entirety of an image. The peripheral area DPA may be a type of non-display area in which display elements are not arranged. The display area DA may be completely surrounded by the peripheral area DPA.

FIG. 1 illustrates that one second display area DA2, in which a component is arranged, is inside the first display area DA1. According to some embodiments, the display apparatus 1 may have two or more second display areas DA2, and the shapes and sizes of the two or more second display areas DA2 may be different from each other. When viewed from a direction substantially perpendicular or normal with respect to the upper surface of the display apparatus 1 (e.g., when viewed in a plan view), the second display area DA2 may have various shapes, for example, a circular shape, an elliptical shape, a polygonal shape such as a rectangular shape, a star shape, or a diamond shape. Although FIG. 1 illustrates that the second display area DA2 is arranged at the upper center (+y direction) of the first display area DA1 substantially having a rectangular shape when viewed from a direction substantially perpendicular to the upper surface of the display apparatus 1, the second display area DA2 may be arranged on one side of the first display area DA1 having the rectangular shape, for example, on the upper right side or the upper left side thereof.

The display apparatus 1 may provide an image by using a plurality of first pixels Pm arranged in the first display area DA1 and a plurality of second pixels Pa arranged in the second display area DA2.

The plurality of second pixels Pa may be arranged in the second display area DA2. The plurality of second pixels Pa may emit light and provide an image. An image displayed in the second display area DA2 is an auxiliary image, and may have a lower resolution than an image displayed in the first display area DA1.

In the second display area DA2, a component 40 (see FIG. 2), which is an electronic element, may be arranged below a display panel. The component 40 is a camera using infrared light or visible light, and may include an imaging device. Alternatively, the component 40 may be a solar cell, a flash, an illumination sensor, a proximity sensor, or an iris sensor. Alternatively, the component 40 may have a sound receiving function. In order to reduce the limitation in the function of the component 40, a second pixel circuit configured to drive the second pixel Pa in the second display area DA2 may not be in the second display area DA2, but may be in the peripheral area DPA.

In the case of the display panel and the display apparatus including the same, according to some embodiments, when light is transmitted through the second display area DA2, the light transmittance thereof may be about 10% or more, and more specifically, about 40% or more, about 25% or more, about 50% or more, about 85% or more, or about 90% or more.

Figure 2:
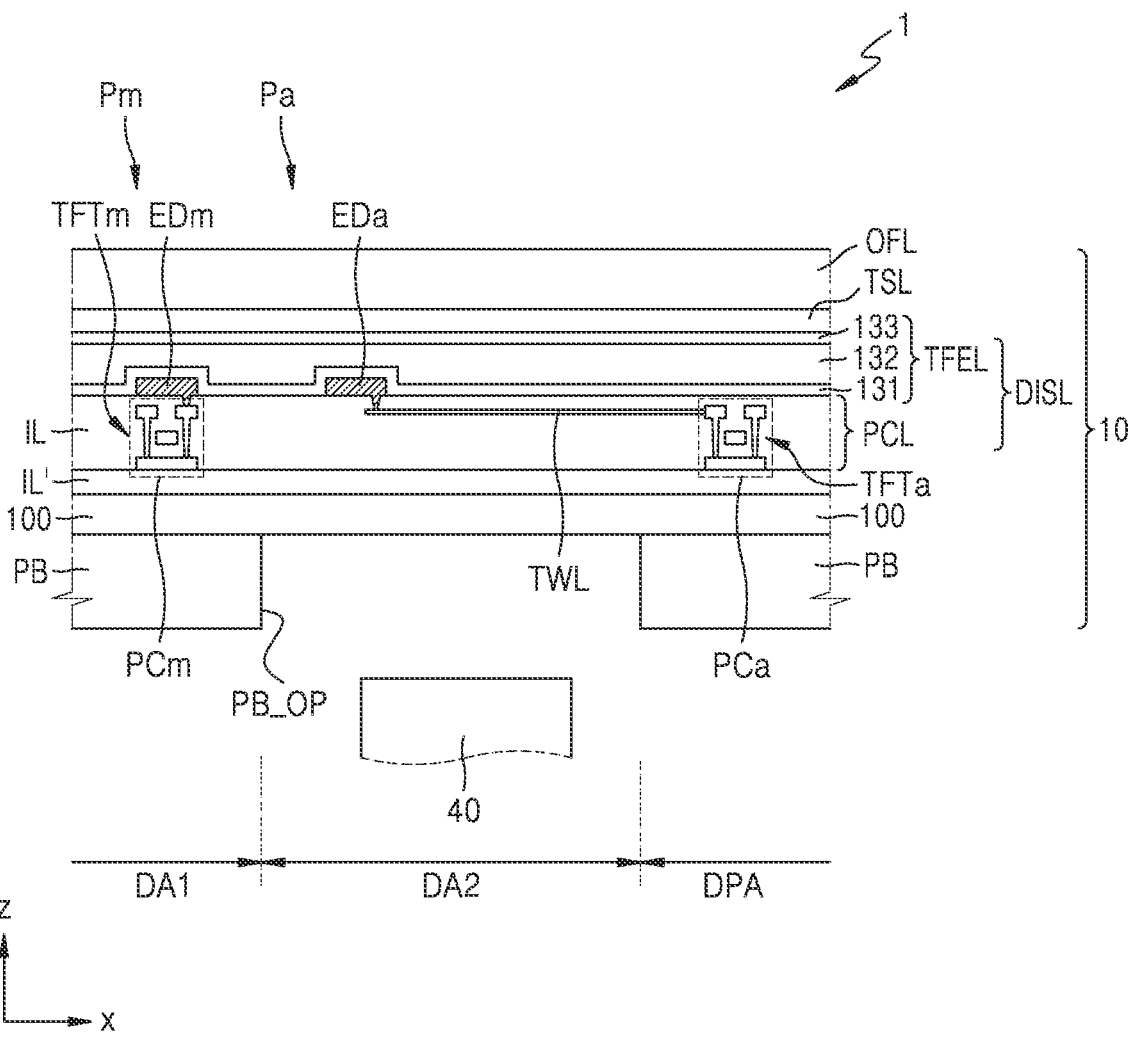
FIG. 2 is a cross-sectional view schematically illustrating a portion of a display apparatus according to some embodiments.

FIG. 2 is a cross-sectional view schematically illustrating a portion of a display apparatus 1 according to some embodiments.

Referring to FIG. 2, the display apparatus 1 may include a display panel 10 and a component 40 overlapping the display panel 10. A cover window that protects the display panel 10 may be further on the display panel 10.

The display panel 10 includes a second display area DA2 overlapping the component 40, and a first display area DA1 in which a main image is displayed. The display panel 10 may include a substrate 100; a display layer DISL, a touch screen layer TSL, and an optical function layer OFL above the substrate 100; and a panel protection member PB below the substrate 100.

The display layer DISL may include a circuit layer PCL including thin-film transistors TFTm and TFTa, a display element layer including light-emitting elements EDm and EDa that are display elements, and a thin-film encapsulation layer TFEL. Insulating layers IL and IL' may be between the substrate 100 and the display layer DISL and inside the display layer DISL.

The substrate 100 may include an insulating material such as glass, quartz, or polymer resin. The substrate 100 may include a rigid substrate or a flexible substrate, for example, a bendable, foldable, or rollable substrate.

A first pixel circuit PCm and a first display element EDm connected thereto may be arranged in the first display area DA1 of the display panel 10. The first pixel circuit PCm may include at least one thin-film transistor TFTm, and may control light emission of the first display element EDm. The first pixel Pm may be implemented by light emission of the first display element EDm.

A second display element EDa may be arranged in the second display area DA2 of the display panel 10 to implement the second pixel Pa. The second display area DA2 is an auxiliary display area, and the resolution of the second display area DA2 may be less than the resolution of the first display area DA1. That is, the number of second display elements EDa per unit area in the second display area DA2 may be less than the number of first display elements EDm per unit area in the first display area DA1.

According to some embodiments, a second pixel circuit PCa configured to drive the second display element EDa may not be arranged in the second display area DA2, but may be arranged in the peripheral area DPA. That is, the second pixel circuit PCa may be arranged so as not to overlap the second display element EDa.

The second pixel circuit PCa may include at least one thin-film transistor TFTa, and may be electrically connected to the second display element EDa by a connection line TWL. The connection line TWL may include a transparent conductive material. The second pixel circuit PCa may control light emission of the second display element EDa. The second pixel Pa may be implemented by light emission of the second display element EDa.

Also, the second display area DA2 may include an area through which light/signal emitted from the component 40 or light/signal incident on the component 40 is transmitted. Because only the second display element EDa and the connection line TWL including a transparent conductive material are arranged in the second display area DA2 and the number of second display elements EDa per area in the second display area DA2 is less than the number of first display elements EDm per area in the first display area DA1, the light transmittance of the second display area DA2 may be high.

The first display element EDm and the second display element EDa, which are display elements, may be covered with the thin-film encapsulation layer TFEL. In some embodiments, the thin-film encapsulation layer TFEL may include at least one inorganic encapsulation layer and at least one organic encapsulation layer, as illustrated in FIG. 2. According to some embodiments, the thin-film encapsulation layer TFEL may include first and second inorganic encapsulation layers 131 and 133 and an organic encapsulation layer 132 therebetween.

The first inorganic encapsulation layer 131 and the second inorganic encapsulation layer 133 may each include at least one inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by chemical vapor deposition (CVD) or the like. The organic encapsulation layer 132 may include a polymer-based material. The polymer-based material may include a silicone-based resin, an acrylic resin, an epoxy-based resin, polyimide, and polyethylene.

The first inorganic encapsulation layer 131, the organic encapsulation layer 132, and the second inorganic encapsulation layer 133 may be provided as one body to cover the first display area DA1 and the second display area DA2.

The touch screen layer TSL may obtain coordinate information according to an external input, for example, a touch event. The touch screen layer TSL may include a touch electrode and touch lines connected to the touch electrode. The touch screen layer TSL may sense an external input by using a self-capacitance method or a mutual capacitance method.

The touch screen layer TSL may be on the thin-film encapsulation layer TFEL. Alternatively, the touch screen layer TSL may be separately formed on a touch substrate and then bonded to the thin-film encapsulation layer TFEL through an adhesive layer such as an optically clear adhesive (OCA). According to some embodiments, the touch screen layer TSL may be directly on the thin-film encapsulation layer TFEL. In this case, the adhesive layer may not be between the touch screen layer TSL and the thin-film encapsulation layer TFEL.

The optical function layer OFL may include an anti-reflective layer. The anti-reflective layer may reduce the reflectance of light (external light) incident from the outside to the display apparatus 1. In some embodiments, the optical function layer OFL may include a polarizing film. In some embodiments, the optical function layer OFL may include a filter plate including a black matrix and color filters.

The panel protection member PB may be attached to the lower portion of the substrate 100 to support and protect the substrate 100. The panel protection member PB may include an opening PB_OP corresponding to the second display area DA2. The opening PB_OP provided in the panel protection member PB may improve the light transmittance of the second display area DA2. The panel protection member PB may include polyethylene terephthalate (PET) or polyimide (PI).

The area of the second display area DA2 may be greater than the area on which the component 40 is arranged. Therefore, the area of the opening PB_OP provided in the panel protection member PB may not match the area of the second display area DA2.

Also, a plurality of components 40 may be arranged in the second display area DA2. The components 40 may have different functions from each other. For example, the components 40 may include at least two selected from a camera (imaging element), a solar cell, a flash, a proximity sensor, an illumination sensor, and an iris sensor, or any other suitable sensor or electronic component according to the design of the display panel 10.

Figure 3A:
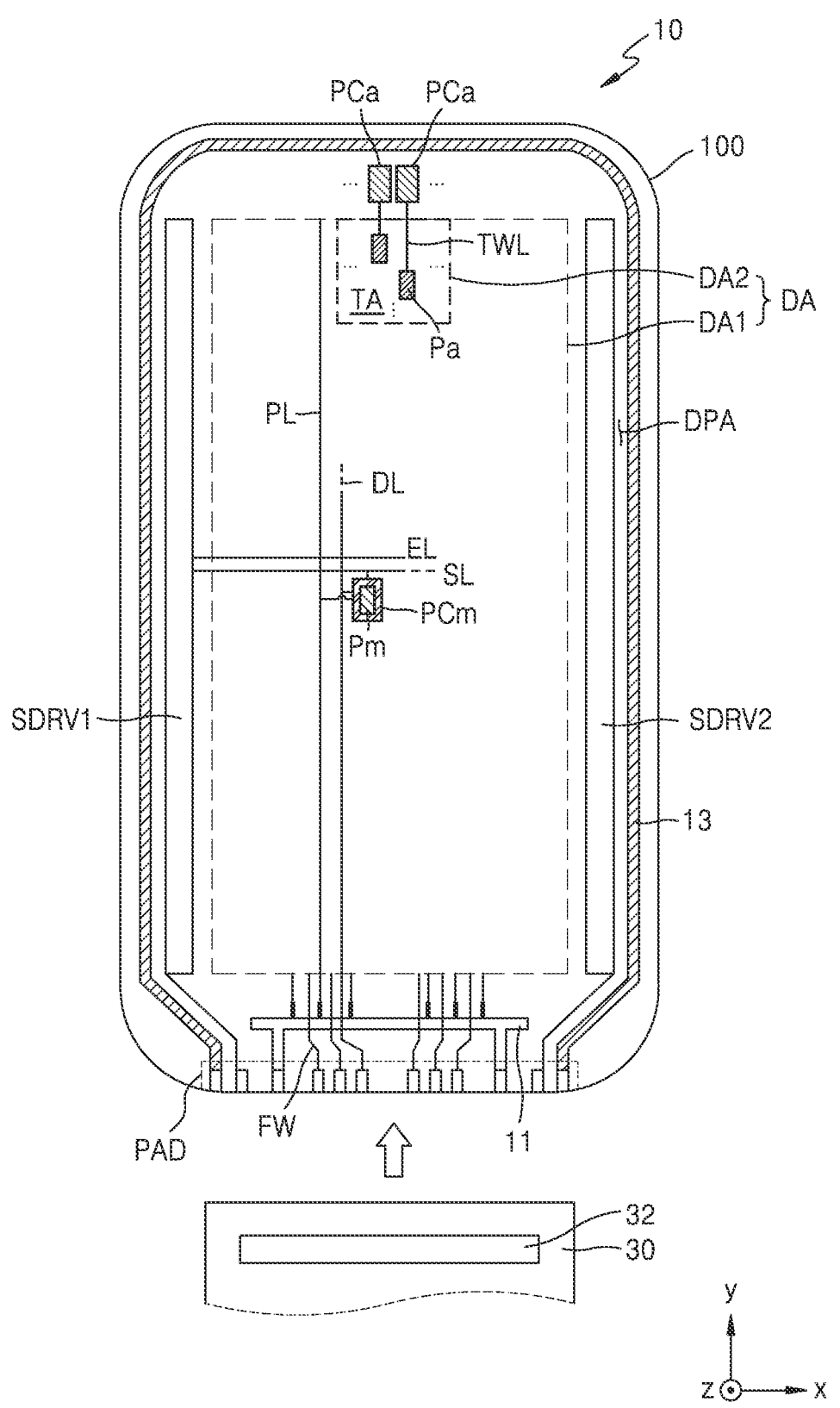
FIGS. 3A and 3B are plan views schematically illustrating a display panel in the display apparatus of FIG. 1, according to some embodiments.
Figure 3B:
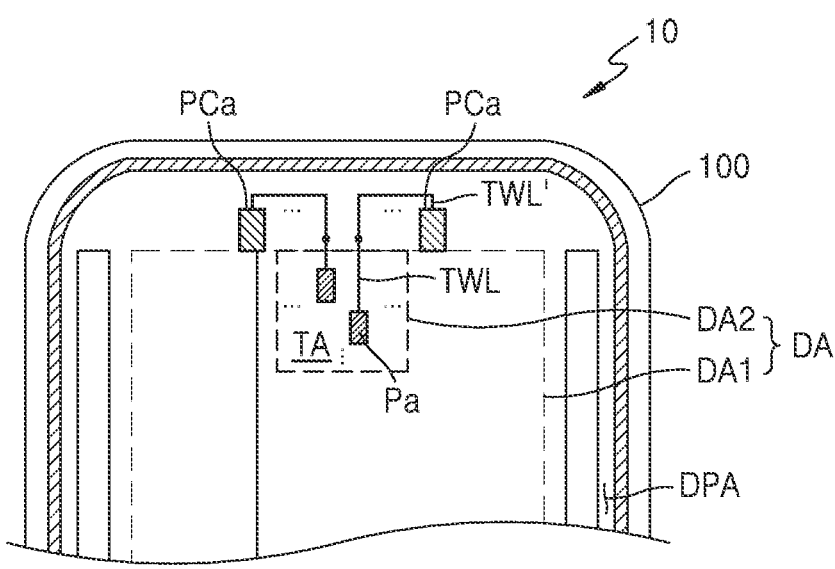

FIGS. 3A and 3B are plan views schematically illustrating a display panel 10 in the display apparatus of FIG. 1, according to some embodiments.

Referring to FIG. 3A, various elements constituting the display panel 10 are on a substrate 100. The substrate 100 includes a display area DA and a peripheral area DPA surrounding the display area DA. The display area DA includes a first display area DA1 in which a main image is displayed and a second display area DA2 in which an auxiliary image (or images) is displayed. The auxiliary image may form one whole image together with the main image, and the auxiliary image may be an image independent from the main image. A pixel circuit portion PCP (shown, for example, in further detail in FIG. 5) in which second pixel circuits PCa for driving second pixels Pa in the second display area DA2 are arranged may be provided in the peripheral area DPA.

A plurality of first pixels Pm are arranged in the first display area DA1. Each of the first pixels Pm may be implemented as a first display element such as an organic light-emitting diode. A first pixel circuit PCm configured to drive the first pixel Pm may be arranged in the first display area DA1, and the first pixel circuit PCm may be arranged to overlap the first pixel Pm. The first pixel Pm may emit, for example, red light, green light, blue light, or white light. The first display area DA1 may be covered with an encapsulation member and protected from ambient air or moisture.

As described above, the second display area DA2 may be at one side of the first display area DA1 or inside the display area DA and surrounded by the first display area DA1. A plurality of second pixels Pa are arranged in the second display area DA2. Each of the second pixels Pa may be implemented as a second display element such as an organic light-emitting diode. The second pixel Pa may emit, for example, red light, green light, blue light, or white light. The second display area DA2 may be covered with an encapsulation member and protected from ambient air or moisture. The resolution of the second display area DA2 may be about ½, ⅜, ⅓, ¼, 2/9, ⅛, ⅑, or 1/16 of the resolution of the first display area DA1. For example, the resolution of the first display area DA1 may be about 400 ppi or more, and the resolution of the second display area DA2 may be about 200 ppi or about 100 ppi.

The second pixel circuit PCa for driving the second pixel Pa may be arranged in the pixel circuit portion PCP arranged in the peripheral area DPA. The pixel circuit portion PCP may be arranged in the peripheral area DPA close to the second display area DA2. For example, when the second display area DA2 is arranged at a top side of the display area DA, the pixel circuit portion PCP may be arranged at a top side of the peripheral area DPA. The second pixel circuit PCa may be connected to a second display element that implements the second pixel Pa, by the connection line TWL extending in a y direction.

In addition to the pixel circuit portion PCP, a first scan driving circuit SDRV1, a second scan driving circuit SDRV2, a terminal portion PAD, a driving voltage supply line 11, and a common voltage supply line 13 may be arranged in the peripheral area DPA. Each of the first pixel circuit PCm and the second pixel circuit PCa may be electrically connected to outer circuits arranged in the peripheral area DPA.

The first scan driving circuit SDRV1 may be configured to apply a scan signal through a main scan line SLm to the first pixel circuit PCm configured to drive the first pixel Pm. The first scan driving circuit SDRV1 may be configured to apply an emission control signal to the pixel circuit through a main emission control line ELm. The second scan driving circuit SDRV2 may be on the opposite side of the first scan driving circuit SDRV1 with respect to the first display area DA1, and may be substantially parallel to the first scan driving circuit SDRV1. Some pixel circuits of the first pixels Pm of the first display area DA1 may be electrically connected to the first scan driving circuit SDRV1, and the others thereof may be electrically connected to the second scan driving circuit SDRV2.

The terminal portion PAD may be arranged at one side of the substrate 100. The terminal portion PAD is exposed without being covered with an insulating layer and is connected to a display circuit board 30. A display driver 32 may be on the display circuit board 30.

The display driver 32 may be configured to generate a control signal to be transmitted to the first scan driving circuit SDRV1 and the second scan driving circuit SDRV2. The display driver 32 may be configured to generate a data signal, and the generated data signal may be transmitted to the first pixel circuits PCm through a fan-out line FW and a main data line DLm connected to the fan-out line FW.

The display driver 32 may be configured to supply a driving voltage ELVDD to a first driving voltage supply line 11, and may be configured to supply a common voltage ELVSS to a common voltage supply line 13. The driving voltage ELVDD may be applied to the pixel circuits of the first and second pixels Pm and Pa through a driving voltage line PL connected to the first driving voltage supply line 11, and the common voltage ELVSS may be connected to a common voltage supply line 13 and applied to the opposite electrode of the display element.

The first driving voltage supply line 11 may extend from the lower side of the first display area DA1 in the x direction. The common voltage supply line 13 has a loop shape with one side open, and may partially surround the display area DA.

Although FIG. 3A illustrates a case in which one second display area DA2 is provided, a plurality of second display areas DA2 may be provided. In this case, the second display areas DA2 may be apart from each other, a first camera may be arranged to correspond to one second display area DA2, and a second camera may be arranged to correspond to another second display area DA2. Alternatively, a camera may be arranged to correspond to one second display area DA2, and an infrared sensor may be arranged to correspond to another second display area DA2. The shapes and sizes of the second display areas DA2 may be different from each other.

On the other hand, the second display area DA2 may have a circular shape, an elliptical shape, a polygonal shape, or an irregular shape. In some embodiments, the second display area DA2 may have an octagonal shape. The second display area DA2 may have any suitable shape according to the design of the display panel 10 including various polygonal shapes, for example, a rectangular shape or a hexagonal shape. The second display area DA2 may be surrounded by the first display area DA1.

In addition, although the second pixel circuit PCa is arranged adjacent to an outer side of the second display area DA2 in FIG. 3A, embodiments according to the present disclosure are not limited thereto. As shown in FIG. 3B, the second pixel circuit PCa may be arranged adjacent to an outer side of the first display area DA1. In some embodiments, the connection line TWL may be connected to the second pixel circuit PCa through the sub-connection line TWL'. In this case, the connection line TWL may be arranged in the second display area DA2, and the sub-connection line TWL' may be arranged in the peripheral area DPA. The connection line TWL may include a transparent conductive material, and the sub-connection line TWL' may include a metal having high conductivity. In some embodiments, the sub-connection line TWL' may be arranged on the same layer as the connection line TWL. According to some embodiments, the sub-connection line TWL' may be arranged on a different layer from the connection line TWL and connected to the connection line TWL through a contact hole.

Figure 4:
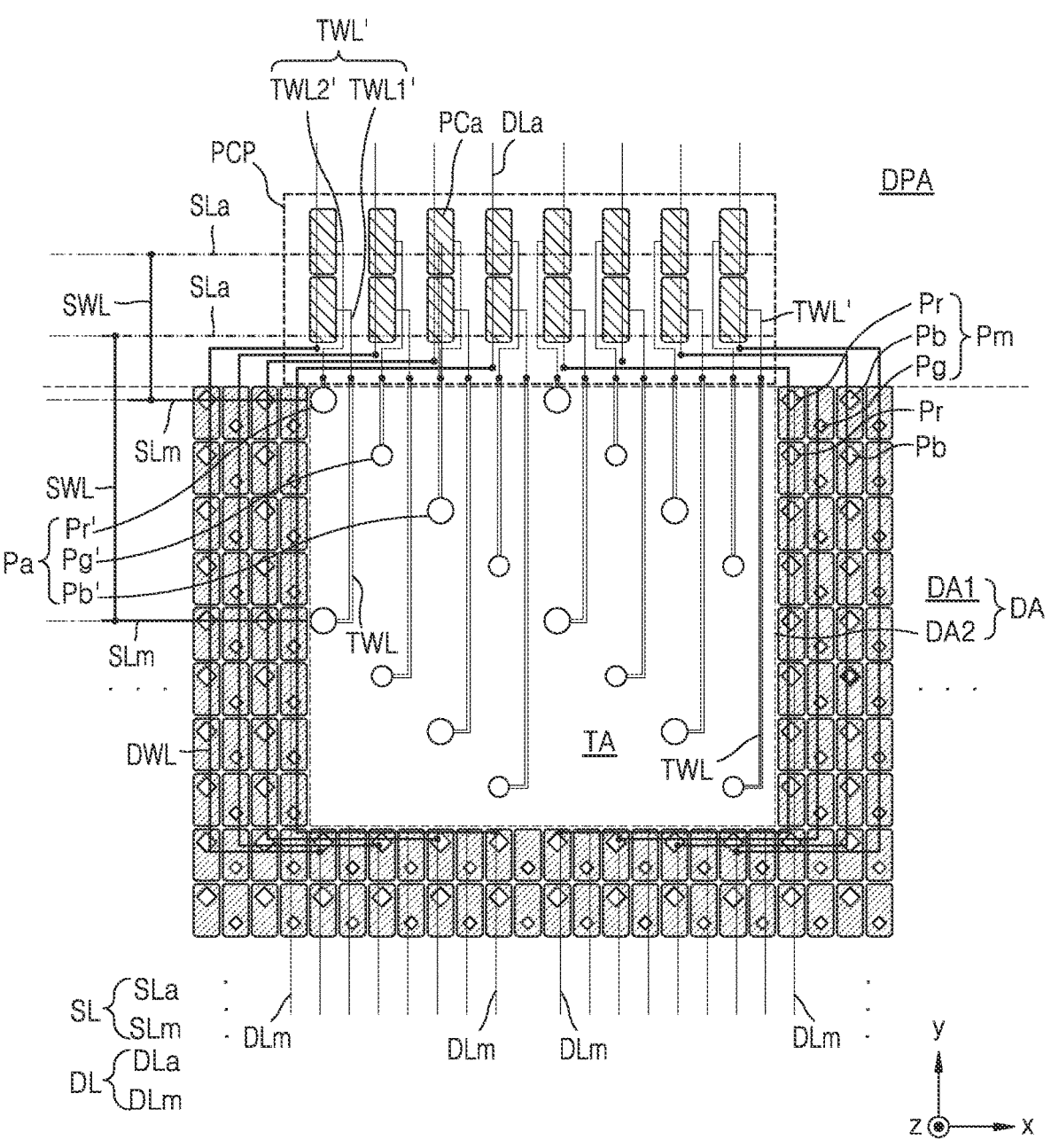
FIG. 4 is a plan layout view schematically illustrating a partial area of a display panel according to some embodiments.

FIG. 4 is a plan layout view schematically illustrating a partial area of a display panel according to some embodiments. For example, FIG. 4 illustrates a second display area DA2, a first display area DA1 therearound, and a pixel circuit portion PCP arranged in a peripheral area DPA.

Referring to FIG. 4, a plurality of first pixels Pm may be arranged in the first display area DA1. In the present disclosure, the first pixel Pm is a sub-pixel, which is a smallest unit for implementing an image, and refers to an emission area that emits light by a display element. When an organic light-emitting diode is used as a display element, the emission area may be defined by an opening of a pixel-defining layer. This will be described below. Each of the plurality of first pixels Pm may emit one of red, green, blue, and white light.

According to some embodiments, a first pixel Pm arranged in the first display area DA1 may include a first sub-pixel Pr, a second sub-pixel Pg, and a third sub-pixel Pb. The first sub-pixel Pr, the second sub-pixel Pg, and the third sub-pixel Pb may implement red, green, and blue, respectively. The first pixels Pm may be arranged in a matrix (e.g. a PenTile® matrix) structure.

For example, first sub-pixels Pr may be arranged at first and third vertices facing each other among vertices of a virtual rectangle having a center point of a second sub-pixel Pg as a center point of the rectangle, and third sub-pixels Pb may be arranged at the remaining vertices, that is, second and fourth vertices. The size of the second sub-pixel Pg may be less than the sizes of the first sub-pixel Pr and the third sub-pixel Pb.

This pixel arrangement structure is referred to as a Pen-Tile matrix structure or a PenTile structure, and may implement high resolution by using a small number of pixels by applying a rendering driving that shares adjacent pixels to express colors.

In FIG. 4, the plurality of first pixels Pm are arranged in a PenTile matrix structure, but embodiments according to the present disclosure are not limited thereto. For example, the plurality of first pixels Pm may be arranged in various shapes such as a stripe structure, a mosaic array structure, a delta array structure, or the like.

In the first display area DA1, first pixel circuits PCm may overlap the first pixels Pm, and may be arranged in a matrix shape in an x direction and a y direction. In the present disclosure, the first pixel circuit PCm refers to a unit of pixel circuit that implements one first pixel Pm.

A plurality of second pixels Pa may be arranged in the second display area DA2. Each of the plurality of second pixels Pa is a sub-pixel, and may emit one of red, green, blue, and white light. The second pixels Pa may include a first sub-pixel Pr', a second sub-pixel Pg', and a third sub-pixel Pb' each emitting light of different colors from each other. The first sub-pixel Pr', the second sub-pixel Pg', and the third sub-pixel Pb' may implement red, green, and blue, respectively.

The number of second pixels Pa arranged in the second display area DA2 per unit area may be less than the number of first pixels Pm arranged in the first display area DA1 per unit area. For example, the number of second pixels Pa and the number of first pixels Pm per same area may be provided in a ratio of 1:2, 1:4, 1:8, or 1:9. In other words, a resolution of the second display area DA2 may be about ½, ¼, ⅛, or ⅑ that of the first display area DA1. In FIG. 4, the resolution of the second display area DA2 is about ⅛ that of the first display area DA1.

The size of the second pixel Pa arranged in the second display area DA2 may be greater than the size of the first pixel Pm arranged in the first display area DA1 and emitting light having the same color as light emitted from the second pixel Pa. For example, the size of the first sub-pixel Pr' of the second display area DA2 may be greater than the size of the first sub-pixel Pr of the first display area DA1. The size of the second sub-pixel Pg' of the second display area DA2 may be greater than the size of the second sub-pixel Pg of the first display area DA1. The size of the third sub-pixel Pb' of the second display area DA2 may be greater than the size of the third sub-pixel Pb of the first display area DA1.

In some embodiments, the second pixel Pa arranged in the second display area DA2 may have a circular shape or a polygonal shape having six or more vertices. This may be to improve the light transmittance of the second display area DA2 and reduce light diffraction. In some embodiments, the shape of the second pixel Pa arranged in the second display area DA2 may be different from the shape of the first pixel Pm arranged in the first display area DA2. For example, the second pixel Pa may have a circular shape, and the first pixel Pm may have a rectangular shape.

Second pixels Pa in the second display area DA2 may be arranged in various shapes. Some of the second pixels Pa may collectively form a pixel group, and the second pixels Pa may be arranged in various shapes such as a PenTile structure, a stripe structure, a mosaic array structure, and a delta array structure within the pixel group. In this case, a distance between the second pixels Pa arranged within the pixel group may be equal to a distance between the first pixels Pm.

According to some embodiments, as shown in FIG. 4, the second pixels Pa may be arranged in a distributed manner in the second display area DA2. In other words, the distance between the second pixels Pa may be greater than the distance between the first pixels Pm. An area of the second display area DA2 in which the second pixels Pa are not arranged may be referred to as a transmissive area TA having a high light transmittance.

Second pixel circuits PCa implementing light emission of the second pixels Pa may be arranged in the peripheral area DPA. Because the second pixel circuits PCa are not arranged in the second display area DA2, a larger transmissive area TA of the second display area DA2 may be ensured. In addition, lines for applying a constant voltage or signals to the second pixel circuit PCa are not arranged in the second display area DA2, and thus, the second pixels Pa may be freely arranged regardless of a line arrangement.

The second pixel circuits PCa may be connected to the second pixels Pa by connection lines. The connection line may include at least one connection line TWL and at least one sub-connection line TWL'.

The connection line TWL is at least partially arranged in the second display area DA2, and may include a transparent conductive material. For example, the connection line TWL may include a transparent conductive oxide (TCO). The connection line TWL may include a conducting oxide such as indium tin oxide (ITO), indium zinc oxide (IZO), zinc oxide (ZnO), indium oxide (In$_2$O$_3$), indium gallium oxide (IGO), or aluminum zinc oxide (AZO).

That the connection line TWL is connected to the second pixel Pa may denote that the connection line TWL is electrically connected to a pixel electrode of a second display element for implementing the second pixel Pa.

The connection line TWL may be connected to the second pixel circuits PCa through the sub-connection line TWL'. The sub-connection line TWL' may be a line arranged in the peripheral area DPA and connected to the second pixel circuit PCa.

The sub-connection line TWL' may include a conductive material including molybdenum (Mo), aluminum (Al), copper (Cu), titanium (Ti), etc., and may include a single layer or multiple layers including the materials described above. A plurality of sub-connection lines TWL' may be provided between the second pixel circuits PCa.

According to some embodiments, the sub-connection line TWL' may include a first sub-connection line TWL1' and a second sub-connection line TWL2' arranged on different layers from each other. For example, the first sub-connection line TWL1' may be arranged on a same layer as a data line DL, and may include the same material as the data line DL. The second sub-connection line TWL2' and the first sub-connection line TWL1' may be arranged with an insulating layer therebetween. For example, the second sub-connection line TWL2' is arranged on a same layer as a first pixel electrode 121 (see FIG. 5) of an organic light-emitting diode OLED (see FIG. 5), and may include the same material as the first pixel electrode 121. In some embodiments, the second sub-connection line TWL2' may include the same material as a connection electrode CM (see FIG. 5), and may be arranged on a same layer as the connection electrode CM.

The first sub-connection line TWL1' and the second sub-connection line TWL2' may be arranged between the second pixel circuits PCa, and may be at least partially bent in a plan view. According to some embodiments, the first sub-connection line TWL1' and the second sub-connection line TWL2' arranged on different layers from each other may be provided in plurality, and the first sub-connection line TWL1' and the second sub-connection line TWL2' may be alternately arranged in areas between the plurality of second pixel circuits PCa.

The connection line TWL is arranged in the second display area DA2, and may be connected to the sub-connection line TWL' at an edge of the second display area DA2. The connection line TWL may include a transparent conductive material.

The sub-connection line TWL' may be arranged on a same layer as the connection line TWL, or may be arranged on a different layer from the connection line TWL. When the sub-connection line TWL' and the connection line TWL are arranged on different layers from each other, the sub-connection line TWL' and the connection line TWL may be connected to each other through a contact hole.

The sub-connection line TWL' may have a higher conductivity than the connection line TWL. Because the sub-connection line TWL' is arranged in the peripheral area DPA, it is not necessary to ensure a light transmittance, and thus, the sub-connection line TWL' may include a material having a lower light transmittance and a higher conductivity than the connection line TWL. Thus, a resistance of the connection line TWL may be reduced.

A scan line SL may include a main scan line SLm connected to the first pixel circuits PCm, and an auxiliary scan line SLa connected to the second pixel circuits PCa. The main scan line SLm extends in the x direction, and may be connected to the first pixel circuits PCm arranged in a same row. The main scan line SLm may not be arranged in the second display area DA2. In other words, the main scan line SLm may be disconnected with the second display area DA2 therebetween. In this case, a main scan line SLm arranged on a left side of the second display area DA2 may receive a signal from the second scan driving circuit SDRV2 (see FIG. 3), and a main scan line SLm arranged on a right side of the second display area DA2 may receive a signal from the first scan driving circuit SDRV1 (see FIG. 3).

The auxiliary scan line SLa may be connected to the second pixel circuits PCa for driving the second pixel Pa arranged in a same row among the second pixel circuits PCa arranged in a same row.

The main scan line SLm and the auxiliary scan line SLa are connected to each other by a scan connection line SWL, and thus, a same signal may be transmitted to a pixel circuit for driving the first pixel Pm and a pixel circuit for driving the second pixel Pa that are arranged in a same row.

The scan connection line SWL is arranged on a different layer from the main scan line SLm and the auxiliary scan line SLa, and the scan connection line SWL may be connected to each of the main scan line SLm and the auxiliary scan line SLa through contact holes. The scan connection line SWL may be arranged in the peripheral area DPA.

The data line DL may include a main data line DLm connected to the first pixel circuits PCm, and an auxiliary data line DLa connected to the second pixel circuits PCa. The main data line DLm extends in the y direction, and may be connected to first pixel circuits PCm arranged in a same column. The auxiliary data line DLa extends in the y direction, and may be connected to second pixel circuits PCa arranged in a same column.

The main data line DLm and the auxiliary data line DLa may be apart from each other with the second display area DA2 therebetween. The main data line DLm and the auxiliary data line DLa are connected to each other by a data connection line DWL, and thus, a same signal may be transmitted to a pixel circuit for driving the first pixel Pm and a pixel circuit for driving the second pixel Pa that are arranged in a same column.

The data connection line DWL may be arranged to bypass the second display area DA2. The data connection line DWL may be arranged to overlap the first pixel circuits PCm arranged in the first display area DA1. As the data connection line DWL is arranged in the first display area DA1, it is not necessary to ensure an additional space in which the data connection line DWL is to be arranged, and thus, a dead space area may be reduced.

The data connection line DWL is arranged on a different layer from the main data line DLm and the auxiliary data line DLa, and the data connection line DWL may be connected to each of the main data line DLm and the auxiliary data line DLa through contact holes.

Figure 5:
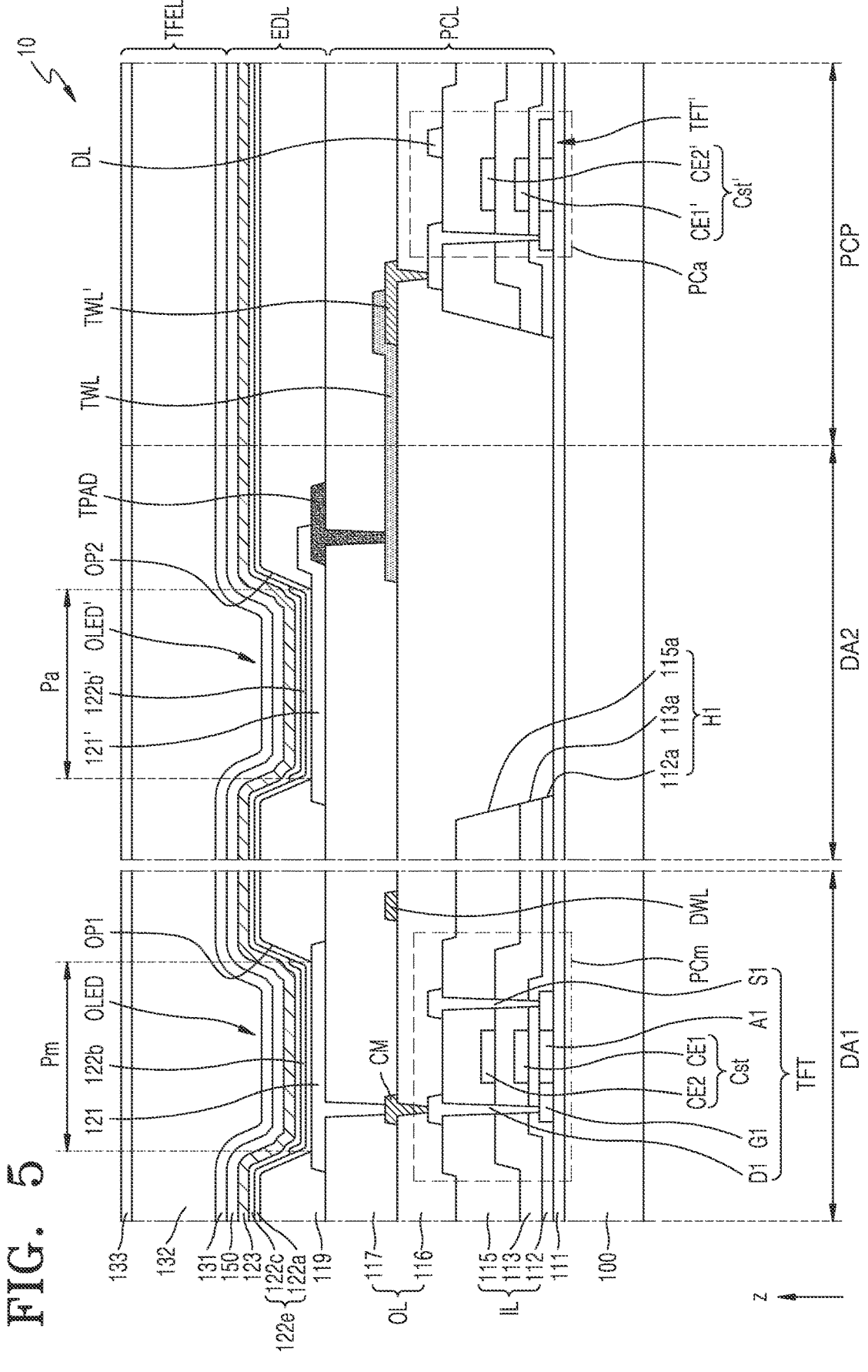
FIG. 5 is a cross-sectional view schematically illustrating a portion of a display panel according to some embodiments.

FIG. 5 is a cross-sectional view schematically illustrating a portion of a display panel 10 according to some embodiments, and illustrates a first display area DA1, a second display area DA2, and a portion of a peripheral area DPA.

Referring to FIG. 5, a first pixel Pm is arranged in the first display area DA1, and a second pixel Pa is arranged in the second display area DA2. A first pixel circuit PCm including a main thin-film transistor TFT and a main storage capacitor Cst, and a first organic light-emitting diode OLED as a first display element connected to the first pixel circuit PCm may be arranged in the first display area DA1. A second organic light-emitting diode OLED' as a second display element may be arranged in the second display area DA2. A second pixel circuit PCa including an auxiliary thin-film transistor TFT' and an auxiliary storage capacitor Cst' may be arranged in the peripheral area DPA. A connection line TWL connecting the second pixel circuit PCa and the second organic light-emitting diode OLED' to each other, and a connection portion TPAD may be arranged in the second display area DA2.

According to some embodiments, it is described as an example that an organic light-emitting diode is used as a display element, but according to some embodiments, an inorganic light-emitting device or a quantum dot light-emitting device may be used as a display element.

A stacked structure of elements included in the display panel 10 will be described below. In the display panel 10, a substrate 100, a buffer layer 111, a circuit layer PCL, and a display element layer EDL may be stacked.

The substrate 100 may include an insulating material such as glass, quartz, and a polymer resin. The substrate 100 may include a rigid substrate, or a flexible substrate that is bendable, foldable, or rollable.

The buffer layer 111 may be on the substrate 100 to reduce or block penetration of foreign materials, moisture, or ambient air from below the substrate 100 and provide a flat surface on the substrate 100. The buffer layer 111 may include an inorganic material such as an oxide or a nitride, an organic material, or an organic or inorganic compound, and may have a single-layer or multi-layer structure of an inorganic material and an organic material. A barrier layer for blocking penetration of ambient air may be further included between the substrate 100 and the buffer layer 111. In some embodiments, the buffer layer 111 may include a silicon oxide ($SiO_2$) or a silicon nitride ($SiN_x$).

The circuit layer PCL is arranged on the buffer layer 111, and may include the first and second pixel circuits PCm and PCa, a first gate insulating layer 112, a second gate insulating layer 113, an interlayer insulating layer 115, a first organic insulating layer 116, and a second organic insulating layer 117. The first pixel circuit PCm may include the main thin-film transistor TFT and the main storage capacitor Cst, and the second pixel circuit PCa may include the auxiliary thin-film transistor TFT' and the auxiliary storage capacitor Cst'.

The main thin-film transistor TFT and the auxiliary thin-film transistor TFT' may be arranged above the buffer layer 111. The main thin-film transistor TFT may include a first semiconductor layer A1, a first gate electrode G1, a first source electrode S1, and a first drain electrode D1. The main thin-film transistor TFT may be connected to the first organic light-emitting diode OLED to drive the first organic light-emitting diode OLED. The auxiliary thin-film transistor TFT' may be connected to the second organic light-emitting diode OLED' to drive the second organic light-emitting diode OLED'. The auxiliary thin-film transistor TFT' has a similar configuration to the main thin-film transistor TFT, and thus, redundant descriptions thereof are omitted.

The first semiconductor layer A1 is arranged on the buffer layer 111, and may include polysilicon. According to some embodiments, the first semiconductor layer A1 may include amorphous silicon. According to some embodiments, the first semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel area, a source area, and a drain area, the source area and the drain area being doped with impurities.

The first gate insulating layer 112 may cover the first semiconductor layer A1. The first gate insulating layer 112 may include an inorganic insulating material such as $SiO_2$, $SiN_x$, $SiOxN_y$, $Al_2O_3$, $TiO_2$, $Ta_2O_5$, $HfO_2$, or ZnO. The first gate insulating layer 112 may include a single layer or multiple layers including the inorganic insulating materials described above.

The first gate electrode G1 is arranged above the first gate insulating layer 112 so as to overlap the first semiconductor layer A1. The first gate electrode G1 includes Mo, Al, Cu, Ti, etc., and may include a single layer or multiple layers. For example, the first gate electrode G1 may include a single Mo layer.

The second gate insulating layer 113 may cover the first gate electrode G1. The second gate insulating layer 113 may include an inorganic insulating material such as $SiO_2$, $SiN_x$, $SiOxN_y$, $Al_2O_3$, $TiO_2$, $Ta_2O_5$, $HfO_2$, or ZnO. The second gate insulating layer 113 may include a single layer or multiple layers including the inorganic insulating materials described above.

An upper electrode CE2 of the main storage capacitor Cst and an upper electrode CE2' of the auxiliary storage capacitor Cst' may be arranged above the second gate insulating layer 113.

In the first display area DA1, the upper electrode CE2 of the main storage capacitor Cst may overlap the first gate electrode G1 therebelow. The first gate electrode G1 and the upper electrode CE2 overlapping each other with the second gate insulating layer 113 therebetween may constitute the main storage capacitor Cst. The first gate electrode G1 may include a lower electrode CE1 of the main storage capacitor Cst.

In the peripheral area DPA, the upper electrode CE2' of the auxiliary storage capacitor Cst' may overlap a gate electrode of the auxiliary thin-film transistor TFT' therebelow. The gate electrode of the auxiliary thin-film transistor TFT' may include a lower electrode CE1' of the auxiliary storage capacitor Cst'.

The upper electrodes CE2 and CE2' may include silver (Al), platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu, and may include a single layer or multiple layers of the materials described above.

The interlayer insulating layer 115 may cover the upper electrodes CE2 and CE2'. The interlayer insulating layer 115 may include $SiO_2$, $SiN_x$, $SiOxN_y$, $Al_2O_3$, $TiO_2$, $Ta_2O_5$, $HfO_2$, ZnO, or the like. The interlayer insulating layer 115 may include a single layer or multiple layers including the inorganic insulating materials described above.

The first source electrode S1 and the first drain electrode D1 may be arranged on the interlayer insulating layer 115. Each of the first source electrode S1 and the first drain electrode D1 may include a conductive material including Mo, Al, Cu, Ti, etc., and may have multiple layers or a single layer including the materials described above. For example, each of the first source electrode S1 and the first drain electrode D1 may have a multi-layer structure of a Ti layer, an A1 layer, and another Ti layer.

An inorganic insulating layer IL of the display panel 10 may have an opening H1 corresponding to the second display area DA2. For example, when the first gate insulating layer 112, the second gate insulating layer 113, and the interlayer insulating layer 115 are collectively referred to as the inorganic insulating layer IL, the inorganic insulating layer IL may have the opening H1 corresponding to the second display area DA2. The opening H1 may expose a portion of an upper surface of the buffer layer 111 or the substrate 100. The opening H1 may be provided by overlapping a first opening 112a of the first gate insulating layer 112, a second opening 113a of the second gate insulating layer 113, and a third opening 115a of the interlayer insulating layer 115 that are provided to correspond to the second display area DA2. The first to third openings 112a, 113a, and 115a may be individually provided through separate processes, or may be simultaneously provided through a same process. The first organic insulating layer 116 may be filled in the opening H1 of the inorganic insulating layer IL.

The first organic insulating layer 116 covers the first and second source electrodes S1 and S2 and the first and second drain electrodes D1 and D2 of the first display area DA1 and the peripheral area DPA, and may fill the opening H1 of the inorganic insulating layer IL in the second display area DA2.

The first organic insulating layer 116 may include any suitable general-purpose polymers such as photosensitive PI, PI, polystyrene (PS), polycarbonate (PC), benzocyclobutene (BCB), hexamethyldisiloxane (HMDSO), polymethyl methacrylate (PMMA), or polystyrene (PS), polymer derivatives having a phenol-based group, acryl-based polymers, imide-based polymers, aryl ether-based polymers, amide-based polymers, fluorine-based polymers, p-xylene-based polymers, or vinyl alcohol-based polymers.

According to some embodiments, the first organic insulating layer 116 may include a siloxane-based organic material. The siloxane-based organic material may include any suitable siloxane-based organic material such as HMDSO, octamethyltrisiloxane, decamethyltetrasiloxane, dodecamethylpentasiloxane, and/or polydimethylsiloxane.

A refractive index of the first organic insulating layer 116 may be about 1.4 to about 1.6 with respect to a wavelength of about 550 nm. A connection electrode CM and various lines such as a data line DL may be arranged above the first organic insulating layer 116, and thus, it may enable relatively high integration.

The connection line TWL may be provided above the first organic insulating layer 116 in the second display area DA2. The connection line TWL extends from the peripheral area DPA to the second display area DA2, and may connect the second organic light-emitting diode OLED' and the second pixel circuit PCa to each other.

The connection line TWL may be connected to the sub-connection line TWL'. The sub-connection line TWL' is arranged in the peripheral area DPA, and may be connected to the second pixel circuit PCa, for example, the auxiliary thin-film transistor TFT'. The connection line TWL may be arranged in a transmissive area of the second display area DA2. An end of the connection line TWL may cover an end of the sub-connection line TWL'.

The sub-connection line TWL' may include a conductive material including Mo, Al, Cu, Ti, or the like, and may include a single layer or multiple layers including the above materials. In some embodiments, the sub-connection line TWL' may include the same material as the connection electrode CM and be on the same layer as the connection electrode CM. In some embodiments, the sub-connection line TWL' may include the same material as the data line DL and be on the same layer as the data line DL. However, the present disclosure is not limited thereto. The sub-connection line TWL' may be arranged on various layers. For example, the sub-connection line TWL' may be arranged on a same layer as a first pixel electrode 121.

The connection line TWL may include a transparent conductive material. For example, the connection line TWL may include a TCO. The connection line TWL may include a conducting oxide such as ITO, IZO, ZnO, $In_2O_3$, IGO, or AZO.

The sub-connection line TWL' may have a higher conductivity than the connection line TWL. Because the sub-connection line TWL' is arranged in the peripheral area DPA, it is not necessary to ensure a light transmittance, and thus, the sub-connection line TWL' may include a material having a lower light transmittance and a higher conductivity than the connection line TWL.

The second organic insulating layer 117 may cover the connection line TWL on the first organic insulating layer 116. The second organic insulating layer 117 may have a flat upper surface so that the first pixel electrode 121 and a second pixel electrode 121' arranged thereon may be provided flat. The second organic insulating layer 117 may include a siloxane-based organic material having high light transmittance and flatness. The siloxane-based organic material may include HMDSO, octamethyltrisiloxane, decamethyltetrasiloxane, dodecamethylpentasiloxane, and polydimethylsiloxane.

The second organic insulating layer 117 may include general-purpose polymers such as photosensitive PI, PI, BCB, HMDSO, PMMA, or PS, polymer derivatives having a phenol-based group, acryl-based polymers, imide-based polymers, aryl ether-based polymers, amide-based polymers, fluorine-based polymers, p-xylene-based polymers, or vinyl alcohol-based polymers.

The first and second organic light-emitting diodes OLED and OLED' may be arranged on the second organic insulating layer 117. The first pixel electrode 121 of the first organic light-emitting diode OLED may be connected to the first pixel circuit PCm through the connection electrode CM arranged on the first organic insulating layer 116. The second pixel electrode 121' of the second organic light-emitting diode OLED' may be connected to the second pixel circuit PCa through the connection portion TPAD and the connection line TWL.

The connection portion TPAD is arranged on the same layer as the second pixel electrode 121', and an end of the second pixel electrode 121' may cover a portion of the connection portion TPAD and be in direct contact with the connection portion TPAD. The connection portion TPAD may include a transparent conductive material. For example, the connection line TWL may include a TCO. The connection line TWL may include a conducting oxide such as ITO, IZO, ZnO, In$_2$O$_3$, IGO, or AZO. As the connection portion TPAD is transparent, the light transmittance thereof may be improved. The connection portion TPAD may be connected to the connection line TWL through a contact hole CNT defined in the second organic insulating layer 117.

Each of the first pixel electrode 121 and the second pixel electrode 121' may include a conducting oxide such as ITO, IZO, ZnO, In$_2$O$_3$, IGO, or AZO. Each of the first pixel electrode 121 and the second pixel electrode 121' may include a reflective layer including Ag, Mg, Al, Pt, Pd, Au, Ni, Nd, Ir, Cr, or a compound thereof. For example, the first pixel electrode 121 and the second pixel electrode 121' may each have a structure that provides layers including ITO, IZO, ZnO, or In$_2$O$_3$ above/below the above-described reflective layer. In this case, each of the first pixel electrode 121 and the second pixel electrode 121' may have a stacked structure of an ITO layer, an Ag layer, and another ITO layer.

A pixel-defining layer 119 covers an edge of each of the first pixel electrode 121 and the second pixel electrode 121' on the second organic insulating layer 117, and may include a first opening OP1 and a second opening OP2 exposing central portions of the first pixel electrode 121 and the second pixel electrode 121', respectively. Sizes and shapes of emission areas of the first and second organic light-emitting diodes OLED and OLED', that is, the first and second sub-pixels Pm and Pa, are defined by the first opening OP1 and the second opening OP2, respectively.

The pixel-defining layer 119 may increase a distance between edges of the first and second pixel electrodes 121 and 121' and an opposite electrode 123 above the first and second pixel electrodes 121 and 121' to thereby prevent or reduce instances of arcs, etc., occurring at the edges of the first and second pixel electrodes 121 and 121'. The pixel-defining layer 119 may include an organic insulating material such as PI, polyamide, acrylic resins, BCB, HMDSO, and phenolic resins, and may be provided by spin coating, etc.

A first emission layer 122b and a second emission layer 122b', which are provided to correspond to the first pixel electrode 121 and the second pixel electrode 121', respectively, may be arranged in the first opening OP1 and the second opening OP2 of the pixel-defining layer 119, respectively. The first emission layer 122b and the second emission layer 122b' may each include a polymer material or a low-molecular weight material, and may emit red, green, blue, or white light.

An organic functional layer 122e may be arranged above and/or below the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged below the first emission layer 122b and the second emission layer 122b'. The first functional layer 122a may include a single layer or multiple layers of organic materials. The first functional layer 122a may include a hole transport layer (HTL) having a single-layer structure. In some embodiments, the first functional layer 122a may include a hole injection layer (HIL) and an HTL. The first functional layer 122a may be integrally provided as a single body to correspond to the first and second organic light-emitting diodes OLED and OLED' that are included in the first display area DA1 and the second display area DA2, respectively.

The second functional layer 122c may be arranged above the first emission layer 122b and the second emission layer 122b'. The second functional layer 122c may include a single layer or multiple layers of organic materials. The second functional layer 122c may include an electron transport layer (ETL) or an electron injection layer (EIL). The second functional layer 122c may be integrally provided as a single body to correspond to the first and second organic light-emitting diodes OLED and OLED' that are included in the first display area DA1 and the second display area DA2, respectively.

The opposite electrode 123 is arranged above the second functional layer 122c. The opposite electrode 123 may include a conductive material having a low work function. For example, the opposite electrode 123 may include a (semi-)transparent layer including Ag, Mg, Al, Pt, Pd, Au, Ni, Nd, Ir, Cr, lithium (Li), Ca, or any alloys thereof. In some embodiments, the opposite electrode 123 may further include a layer including ITO, IZO, ZnO, or In$_2$O$_3$, above the (semi-)transparent layer including the materials described above. The opposite electrode 123 may be integrally provided as a single body to correspond to the first and second organic light-emitting diodes OLED and OLED' that are included in the first display area DA1 and the second display area DA2, respectively.

Layers from the first pixel electrode 121 to the opposite electrode 123, which are provided in the first display area DA1, may constitute the first organic light-emitting diode OLED. Layers from the second pixel electrode 121' to the opposite electrode 123, which are provided in the second display area DA2, may constitute the second organic light-emitting diode OLED'.

An upper layer 150 including an organic material may be provided on the opposite electrode 123. The upper layer 150 may protect the opposite electrode 123 and improve light extraction efficiency. The upper layer 150 may include an organic material having a higher refractive index than the opposite electrode 123. In some embodiments, the upper layer 150 may include a stack of layers having different refractive indices. For example, the upper layer 150 may be provided by stacking a high-refractive index layer/low-refractive index layer/high-refractive index layer. A refractive index of the high-refractive index layer may be about 1.7 or greater, and a refractive index of the low-refractive index layer may be about 1.3 or less.

The upper layer 150 may further include lithium fluoride (LiF). In some embodiments, the upper layer 150 may further include an inorganic insulating material such as SiO$_2$ and SiN$_x$.

A thin-film encapsulation layer TFEL is arranged on the upper layer 150, and the first and second organic light-emitting diodes OLED and OLED' may be sealed by the thin-film encapsulation layer TFEL. The thin-film encapsulation layer TFEL may prevent or reduce external moisture or foreign materials penetrating into the first and second organic light-emitting diodes OLED and OLED'.

The thin-film encapsulation layer TFEL may include at least one inorganic encapsulation layer and at least one organic encapsulation layer. In this regard, FIG. 5 shows that the thin-film encapsulation layer TFEL has a stacked structure of a first inorganic encapsulation layer 131, an organic encapsulation layer 132, and a second inorganic encapsulation layer 133. According to some embodiments, the number of organic encapsulation layers, the number of inorganic encapsulation layers, and a stacked order may be changed.

Each of the first inorganic encapsulation layer 131 and the second inorganic encapsulation layer 133 may include one or more inorganic insulating materials such as $SiO_2$, $SiN_x$, $SiO_xN_y$, $Al_2O_3$, $TiO_2$, $Ta_2O_5$, $HfO_2$, or ZnO, and may be provided by CVD. The organic encapsulation layer 132 may include a polymer-based material. The polymer-based material may include silicon-based resins, acryl-based resins, epoxy-based resins, PI, and polyethylene. The first inorganic encapsulation layer 131, the organic encapsulation layer 132, and the second inorganic encapsulation layer 133 may be integrally provided as a single body so as to cover the first display area DA1 and the second display area DA2.

Figure 6:
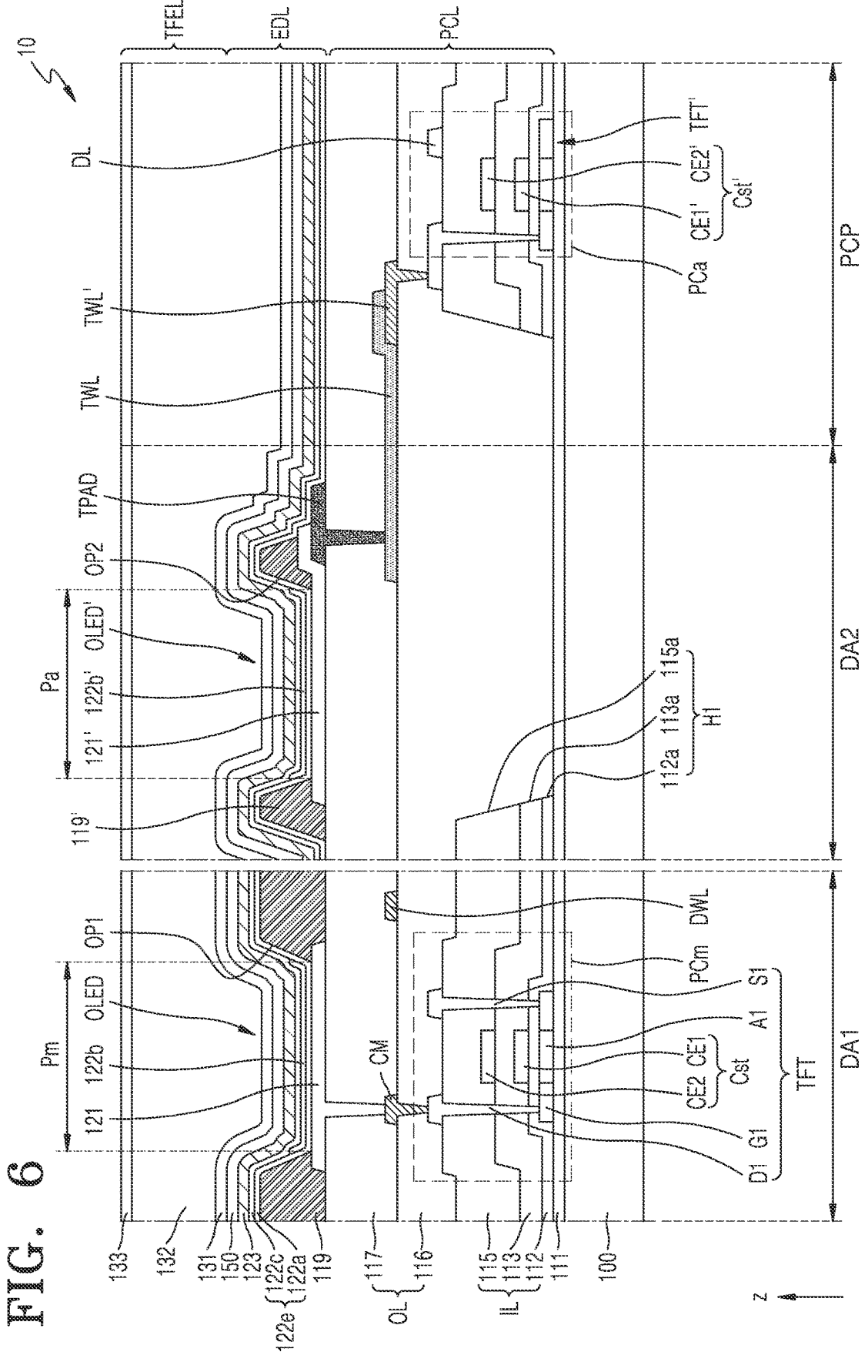
FIG. 6 is a cross-sectional view schematically illustrating a portion of a display panel according to some embodiments.

FIG. 6 is a cross-sectional view schematically illustrating a portion of a display panel 10 according to some embodiments, and illustrates a first display area DA1, a second display area DA2, and a portion of a peripheral area DPA. In FIG. 6, the same reference numerals as those of FIG. 5 denote the same components, and redundant descriptions thereof are omitted.

Referring to FIG. 6, the first pixel Pm is arranged in the first display area DA1, and the second pixel Pa is arranged in the second display area DA. A first pixel circuit PCm including a main thin-film transistor TFT and a main storage capacitor Cst, and a first organic light-emitting diode OLED as a first display element connected to the first pixel circuit PCm may be arranged in the first display area DA1. A second organic light-emitting diode OLED' as a second display element may be arranged in the second display area DA2. A second pixel circuit PCa including an auxiliary thin-film transistor TFT' and an auxiliary storage capacitor Cst' may be arranged in the peripheral area DPA. A connection line TWL connecting the second pixel circuit PCa and the second organic light-emitting diode OLED' to each other, and a connection portion TPAD may be arranged in the second display area DA2.

According to some embodiments, a pixel-defining layer 119' arranged in the second display area DA2 may be apart from a pixel-defining layer 119 arranged in the first display area DA1. Each of the pixel-defining layers 119 and 119' may include a light-blocking material. For example, each of the pixel-defining layers 119 and 119' may include a black pigment or an insulating material (e.g., an organic insulating material) including a dye. As such, the pixel-defining layers 119 and 119' provided as light-blocking layers may prevent or reduce color mixing between adjacent pixels and may absorb light reflected by the component 40 (see FIG. 2) to the display panel 10 to improve visibility.

As each of the pixel-defining layers 119 and 119' includes a light-blocking material, the pixel-defining layer 119' arranged in the second display area DA2 may be patterned for each second pixel Pa. The pixel-defining layer 119' may expose at least a portion of the connection portion TPAD. Because the connection portion TPAD includes a transparent conductive oxide, light may pass through the connection portion TPAD. An area in the second display area DA2 in which the second pixel electrode 121' and the pixel-defining layer 119' are not arranged may function as a transmissive area TA.

Figure 7:
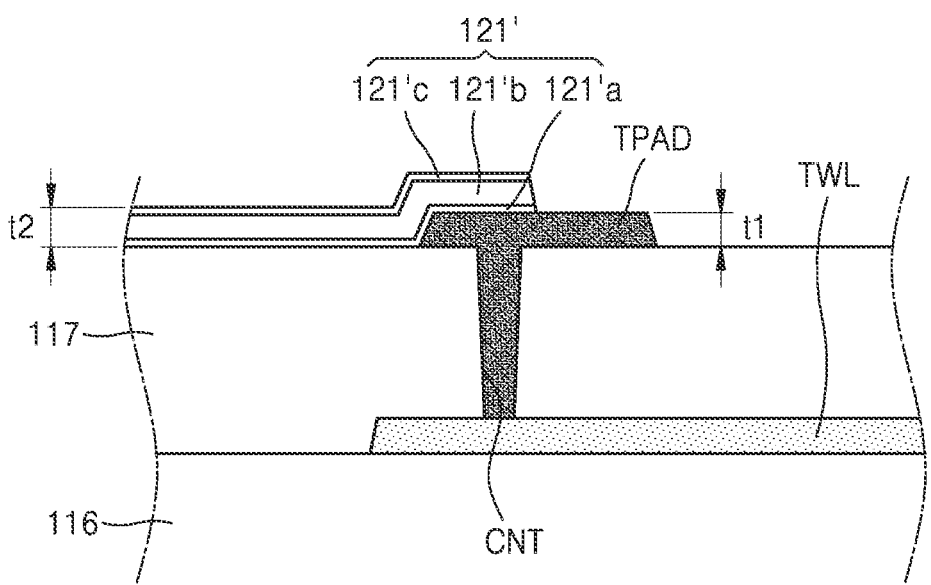
FIG. 7 is a cross-sectional view illustrating a portion of a display apparatus according to some embodiments.

FIG. 7 is a cross-sectional view illustrating a portion of a display apparatus according to some embodiments. For example, FIG. 7 shows a second pixel electrode 121' and a connection portion TPAD.

According to some embodiments, the second pixel electrode 121' may have a multi-layer structure. The second pixel electrode 121' may be provided by sequentially stacking a first layer 121'a, a second layer 121'b, and a third layer 121'c.

Each of the first layer 121'a and the third layer 121'c may include a conductive oxide such as ITO, IZO, ZnO, $In_2O_3$, IGO, or AZO. For example, each of the first layer 121'a and the third layer 121'c may include ITO. The second layer 121'b may include a reflective layer including Ag, Mg, Al, Pt, Pd, Au, Ni, Nd, Ir, Cr, or any compounds thereof.

A thickness t2 of the second pixel electrode 121' may be about 1000 Å to about 1500 Å. In this case, the thickness of each of the first layer 121'a and the third layer 121'c may be about 80 Å to about 150 Å. The thickness of the second layer 121'b may be about 800 Å to about 1200 Å. That is, the thickness of the second layer 121'b may be greater than the thicknesses of the first layer 121'a and the third layer 121'c.

The connection portion TPAD may include a conducting oxide such as ITO, IZO, ZnO, $In_2O_3$, IGO, or AZO. In some embodiments, the connection portion TPAD may include the same material as the first layer 121'a of the second pixel electrode 121'. Accordingly, an adhesive force between the connection portion TPAD and the second pixel electrode 121' may be improved. According to some embodiments, the connection portion TPAD may include ITO.

A thickness t1 of the connection portion TPAD may be about 1000 Å to about 1500 Å. The thickness t1 of the connection portion TPAD may be substantially equal to the thickness t2 of the second pixel electrode 121'. In this case, the thickness t1 of the connection portion TPAD may refer to a thickness from the upper surface of a second organic insulating layer 117 to the upper surface of the connection portion TPAD.

The connection portion TPAD may be connected to a connection line TWL through a contact hole CNT provided in the second organic insulating layer 117. The connection line TWL may include the same material as the connection portion TPAD. The thickness of the connection line TWL may be substantially equal to the thickness t1 of the connection portion TPAD.

Figure 8:
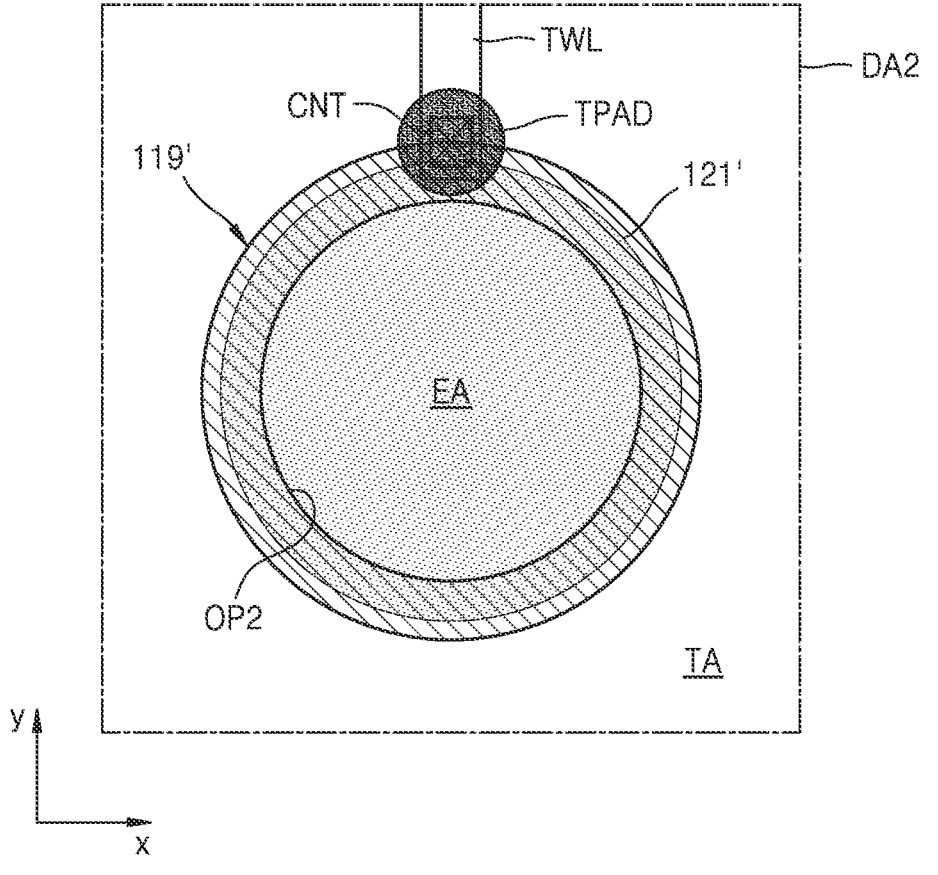
FIG. 8 is a plan layout view illustrating an auxiliary sub-pixel of a display apparatus according to some embodiments.

FIG. 8 is a plan layout view illustrating an auxiliary sub-pixel of a display apparatus according to some embodiments.

Referring to FIG. 8, at least a portion of a second pixel electrode 121' of the second pixel Pa may have a rounded shape. According to some embodiments, the second pixel electrode 121' may have a substantially circular shape, as shown in FIG. 8. As the second pixel electrode 121' has a rounded shape, an angled corner portion outside the second pixel electrode 121' may be reduced or removed in a second display area DA2, thereby preventing or reducing the deterioration of display quality due to diffraction of reflected light.

A connection portion TPAD may be arranged on one side of the second pixel electrode 121'. The connection portion TPAD may be arranged below the second pixel electrode 121', and an end of the second pixel electrode 121' may cover at least a portion of the connection portion TPAD. At least a portion of the connection portion TPAD may have a rounded shape. For example, the connection portion TPAD may have a substantially circular shape. Because the connection portion TPAD may include a transparent conductive oxide, light may pass through an area in which the connection portion TPAD is arranged. Accordingly, the light transmittance of the second display area DA2 may be further improved. The connection portion TPAD may be connected to a connection line TWL arranged on another layer through a contact hole CNT.

The connection portion TPAD and the contact hole CNT may not overlap a second opening OP2 of a pixel-defining layer 119', which is defined as an emission area EA. This is because, when the connection portion TPAD and the contact hole CNT overlap the emission area EA, the flatness of the emission area EA may be lowered and thus the impression of a color may be distorted.

When the connection portion TPAD is not present and the second pixel electrode 121' is connected to the connection line TWL, the second pixel electrode 121' has to extend to an area in which the contact hole CNT is arranged, and thus, a transmissive area TA may be relatively reduced. In addition, when only a portion of the second pixel electrode 121' extends to an area in which the contact hole CNT is arranged, an angled shape or a protruding shape may be added to the second pixel electrode 121'. Accordingly, light reflection and diffraction may occur.

According to some embodiments, by introducing the connection portion TPAD, the reflection or diffraction of external light by the second pixel electrode 121' may be reduced and the light transmittance of the second display area DA2 may also be improved. According to some embodiments, at least a portion of the edge of the connection portion TPAD may have a rounded shape. For example, the connection portion TPAD may have a circular shape or an oval shape. Although the connection portion TPAD includes a transparent material, diffraction and reflection may occur due to a difference in refractive index from layers arranged above and below the connection portion TPAD. As the connection portion TPAD has a rounded shape, diffraction and reflection of light may be reduced.

A pixel-defining layer 119' defining the emission area EA may be arranged on the second pixel electrode 121'. The emission area EA may be defined by a second opening OP2 exposing a central portion of the second pixel electrode 121'. At least a portion of the emission area EA of the pixel-defining layer 119', that is, the second opening OP2, may have a rounded shape. For example, the second opening OP2 may have a substantially circular shape as shown in FIG. 8.

The pixel-defining layer 119' may be patterned for each second pixel Pa and may include a light-blocking material. The pixel-defining layer 119' may have a ring shape. The pixel-defining layer 119' may have a shape in which at least a portion of an outer portion thereof is rounded. The outer size of the pixel-defining layer 119' may be greater than the size of the second pixel electrode 121'. The pixel-defining layer 119' may be arranged to cover an edge of the second pixel electrode 121'.

Because the pixel-defining layer 119' includes a light-blocking material, the pixel-defining layer 119' may function as a black matrix. That is, the pixel-defining layer 119' may prevent or reduce light passing through the second display area DA2 from being diffracted through the edge of the second pixel electrode 121'.

Figure 9:
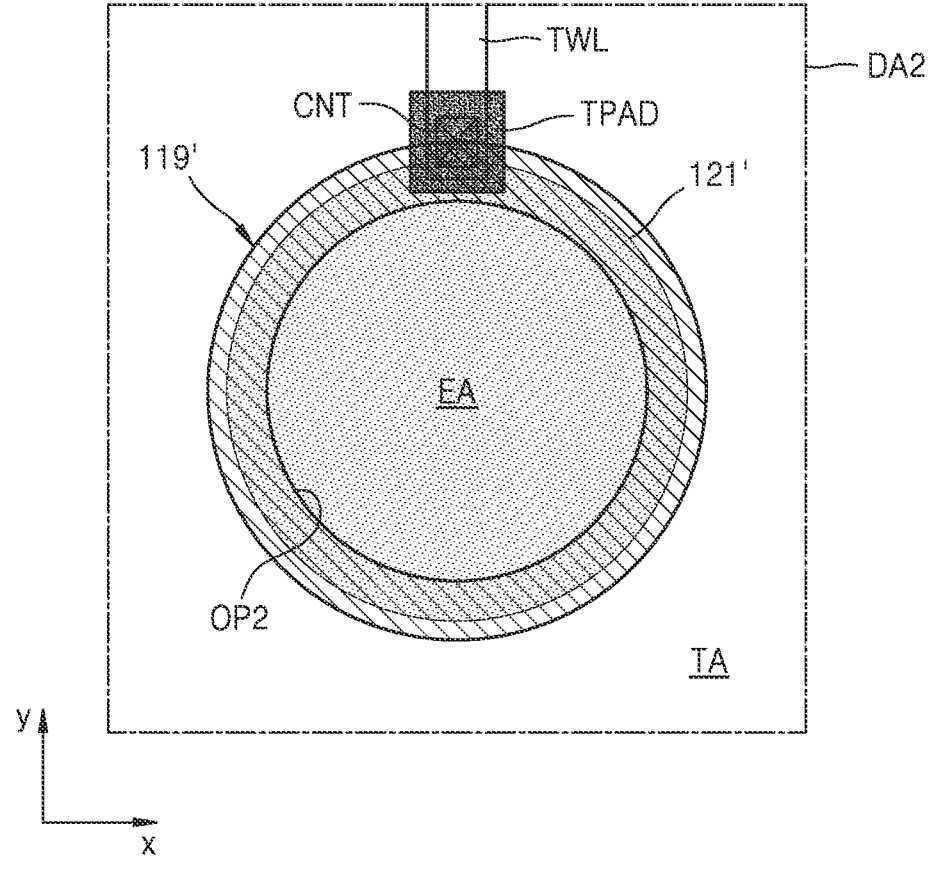
FIGS. 9 to 11 are plan layout views illustrating an auxiliary sub-pixel of a display device according to some embodiments.
Figure 10:
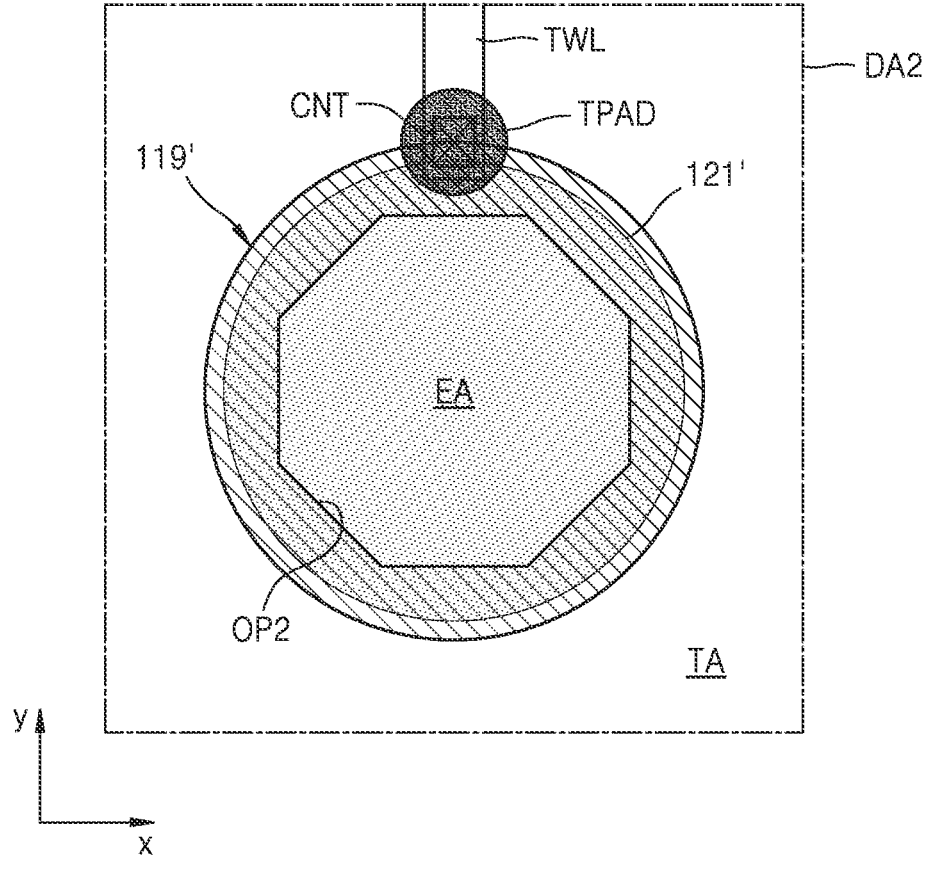
Figure 11:
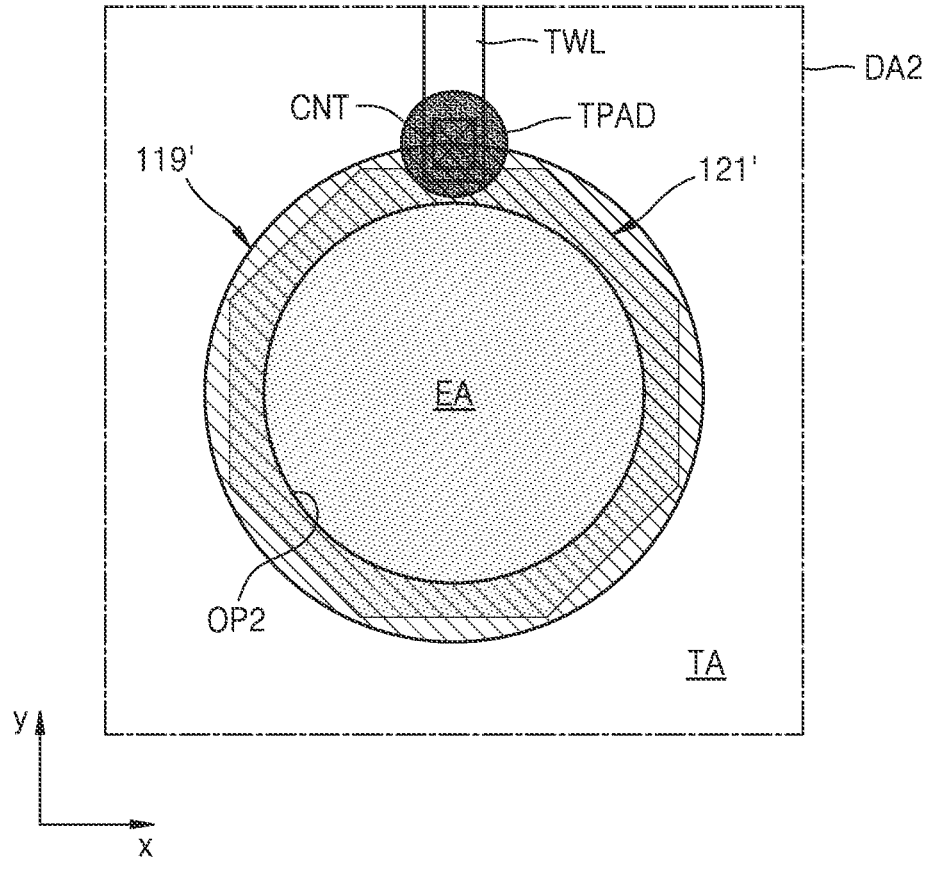

FIGS. 9 to 11 are plan layout views illustrating an auxiliary sub-pixel of a display apparatus according to embodiments. In FIGS. 9 to 11, the same reference numerals as those of FIG. 8 refer to the same members, and a redundant description thereof will be omitted.

Referring to FIG. 9, a connection portion TPAD may have a polygonal shape instead of a circular shape. For example, the connection portion TPAD may have a rectangular shape. The connection portion TPAD may include a light-transmitting material, and thus, light diffraction and reflection by the connection portion TPAD may be insignificant. Accordingly, the connection portion TPAD may not have a rounded shape.

Referring to FIG. 10, the shape of an emission area EA may be different from that of a second pixel electrode 121'. That is, the emission area EA defined by an opening OP2 of a pixel-defining layer 119 may have a hexagonal or a more polygonal shape. Although FIG. 10 illustrates an example in which the emission area EA has an octagonal shape, the emission area EA may have one of various shapes such as a hexagon and a dodecagon. Also, it goes without saying that the emission area EA may have a polygonal shape with rounded corners.

Referring to FIG. 11, the second pixel electrode 121' may have a polygonal shape with rounded corners. Although FIG. 10 illustrates an example in which the second pixel electrode 121' has an octagonal shape with rounded corners, the second pixel electrode 121' may have one of various shapes such as a rounded hexagon and a dodecagon.

As described above, in the display panel and the display apparatus according to some embodiments, a pixel circuit is not arranged in an area in which a component is arranged, and thus, a wide transmission area may be secured, thereby improving transmittance.

In addition, in the display panel and the display apparatus according to the embodiments, a connection portion connected to a display element is introduced in the area in which the component is arranged, and thus, a wider transmission area may be secured, thereby improving transmittance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
   a substrate including a first display area, a second display area, and a peripheral area;
   a first pixel circuit at the first display area and a first display element connected to the first pixel circuit;
   a second display element at the second display area;
   a second pixel circuit at the peripheral area;
   a connection line between the substrate and the second display element and connecting the second display element to the second pixel circuit; and
   a connection portion on a different layer from the connection line and connected to the second display element,
   wherein the second display element includes a second pixel electrode, wherein the second pixel electrode at least partially overlaps with the connection portion along a direction parallel to a plane of a display surface of the display panel and at least partially covers at least a portion of the connection portion along a direction perpendicular to the plane of the display surface of the display panel.

2. The display panel of claim 1, wherein the connection portion includes a transparent conductive oxide.

3. The display panel of claim 1, wherein at least a portion of an edge of the second pixel electrode has a round shape.

4. The display panel of claim 1, wherein the second pixel electrode has a circular shape.

5. The display panel of claim 1, further comprising a pixel-defining layer having an opening exposing a center of the second pixel electrode, and covering an edge of the second pixel electrode, wherein the pixel-defining layer includes a light-blocking material.

6. The display panel of claim 5, wherein the pixel-defining layer has a donut shape.

7. The display panel of claim 5, wherein at least a portion of the opening of the pixel-defining layer has a round shape.

8. The display panel of claim 1, wherein a thickness of the second pixel electrode and a thickness of the connection portion are each in a range of 1000 Å to 1500 Å.

9. The display panel of claim 1, wherein the connection portion has a polygonal shape in a plan view.

10. The display panel of claim 1, wherein a shape of an emission area of the second display element is different from a shape of the second pixel electrode.

11. The display panel of claim 1, wherein the second pixel electrode has a polygonal shape with round corners.

12. A display apparatus comprising:

a display panel including a first display area, a second display area, and a peripheral area; and a component below the display panel corresponding with the second display area, wherein the display panel includes:

a substrate;

a first pixel circuit at the first display area and a first display element connected to the first pixel circuit;

a second display element at the second display area;

a second pixel circuit at the peripheral area;

a connection line between the substrate and the second display element and connecting the second display element to the second pixel circuit; and a connection portion on a different layer from the connection line and connected to the second display element, wherein the second display element includes a second pixel electrode, wherein the second pixel electrode at least partially overlaps with the connection portion along a direction parallel to a plane of a display surface of the display panel and at least partially covers at least a portion of the connection portion along a direction perpendicular to the plane of the display surface of the display panel.

13. The display apparatus of claim 12, wherein the connection portion includes a transparent conductive oxide.

14. The display apparatus of claim 12, wherein at least a portion of an edge of the second pixel electrode has a round shape.

15. The display apparatus of claim 12, wherein the display panel further includes a pixel-defining layer having an opening exposing a center of the second pixel electrode, and covering an edge of the second pixel electrode, wherein the pixel-defining layer includes a light-blocking material.

16. The display apparatus of claim 15, wherein at least a portion of the opening of the pixel-defining layer has a round shape.

17. The display apparatus of claim 12, wherein a shape of an emission area of the second display element is different from a shape of the second pixel electrode.

18. The display apparatus of claim 12, wherein a thickness of the second pixel electrode and a thickness of the connection portion are each in a range of 1000 Å to 1500 Å.

19. The display apparatus of claim 12, wherein the second pixel electrode has a circular shape.

20. The display apparatus of claim 12, wherein the component includes an imaging device.

* * * * *